United States Patent
Shin et al.

(10) Patent No.: US 9,823,299 B2
(45) Date of Patent: Nov. 21, 2017

(54) SOCKET FOR SEMICONDUCTOR CHIP TEST AND METHOD OF MANUFACTURING THE SAME

(71) Applicants: Jong Cheon Shin, Gyeonggi-do (KR); Dong Ho Ha, Gyeonggi-do (KR)

(72) Inventors: Jong Cheon Shin, Gyeonggi-do (KR); Dong Ho Ha, Gyeonggi-do (KR)

( * ) Notice: Subject to any disclaimer, the term of this patent is extended or adjusted under 35 U.S.C. 154(b) by 244 days.

(21) Appl. No.: 14/784,071

(22) PCT Filed: Feb. 11, 2014

(86) PCT No.: PCT/KR2014/001122
§ 371 (c)(1),
(2) Date: Oct. 13, 2015

(87) PCT Pub. No.: WO2014/171621
PCT Pub. Date: Oct. 23, 2014

(65) Prior Publication Data
US 2016/0054384 A1    Feb. 25, 2016

(30) Foreign Application Priority Data

Apr. 16, 2013 (KR) ........................ 10-2013-0041650

(51) Int. Cl.
*G01R 31/28* (2006.01)
*G01R 1/04* (2006.01)
*G01R 3/00* (2006.01)

(52) U.S. Cl.
CPC ....... *G01R 31/2884* (2013.01); *G01R 1/0433* (2013.01); *G01R 3/00* (2013.01)

(58) Field of Classification Search
CPC ..... G01R 31/2884; G01R 1/0433; G01R 3/00

USPC .......................................... 439/65
See application file for complete search history.

(56) References Cited

U.S. PATENT DOCUMENTS

| | | | | | |
|---|---|---|---|---|---|
| 4,655,519 | A | * | 4/1987 | Evans | H05K 7/1069 439/514 |
| 4,783,719 | A | * | 11/1988 | Jamison | G01R 1/0483 174/538 |
| 5,632,631 | A | * | 5/1997 | Fjelstad | G01R 1/0466 257/E23.067 |
| 6,152,744 | A | * | 11/2000 | Maeda | G01R 1/0483 439/331 |

(Continued)

FOREIGN PATENT DOCUMENTS

| | | |
|---|---|---|
| JP | 2000150096 A | 5/2000 |
| JP | 2004047336 A | 2/2004 |

(Continued)

OTHER PUBLICATIONS

International Search Report; International Application No. PCT/KR2014/001122; dated Feb. 11, 2014; Korean Intellectual Property Office, Korea.

*Primary Examiner* — Alexander Gilman
(74) *Attorney, Agent, or Firm* — Rabin & Berdo, P.C.

(57) ABSTRACT

Provided are a socket for a semiconductor chip test, and a method of manufacturing the same, the socket for the semiconductor chip test including: a film layer; a semiconductor chip test terminal disposed on the film layer and connected to a terminal of a semiconductor chip; and a conductive elastic pad disposed on the film layer and connected to a ground terminal of the semiconductor chip.

11 Claims, 5 Drawing Sheets

(56) References Cited

U.S. PATENT DOCUMENTS

| | | | | |
|---|---|---|---|---|
| 6,246,249 B1* | 6/2001 | Fukasawa | ............ | G01R 31/2886 |
| | | | | 324/756.02 |
| 6,937,044 B1* | 8/2005 | Agahdel | ............... | G01R 1/0483 |
| | | | | 324/756.02 |
| 7,097,466 B2* | 8/2006 | Asai | .................... | H01R 12/7082 |
| | | | | 439/76.1 |
| 8,033,838 B2* | 10/2011 | Eldridge | ............ | G01R 1/06727 |
| | | | | 439/81 |
| 8,102,184 B2* | 1/2012 | Sherry | ............... | G01R 1/06716 |
| | | | | 324/754.03 |
| 9,702,903 B2* | 7/2017 | Chen | ..................... | G01R 1/0466 |
| 2007/0054109 A1* | 3/2007 | Lin | ................... | G02F 1/133385 |
| | | | | 428/316.6 |

FOREIGN PATENT DOCUMENTS

| | | | |
|---|---|---|---|
| JP | 2008108453 | A | 5/2008 |
| KR | 101071371 | B1 | 10/2011 |
| KR | 101108481 | B1 | 1/2012 |

\* cited by examiner

【Figure 1】
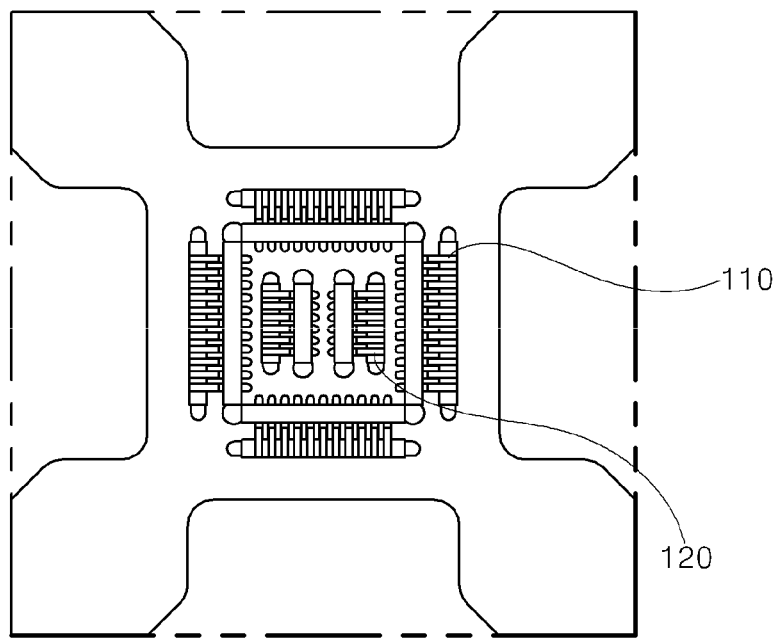

[Figure 2]
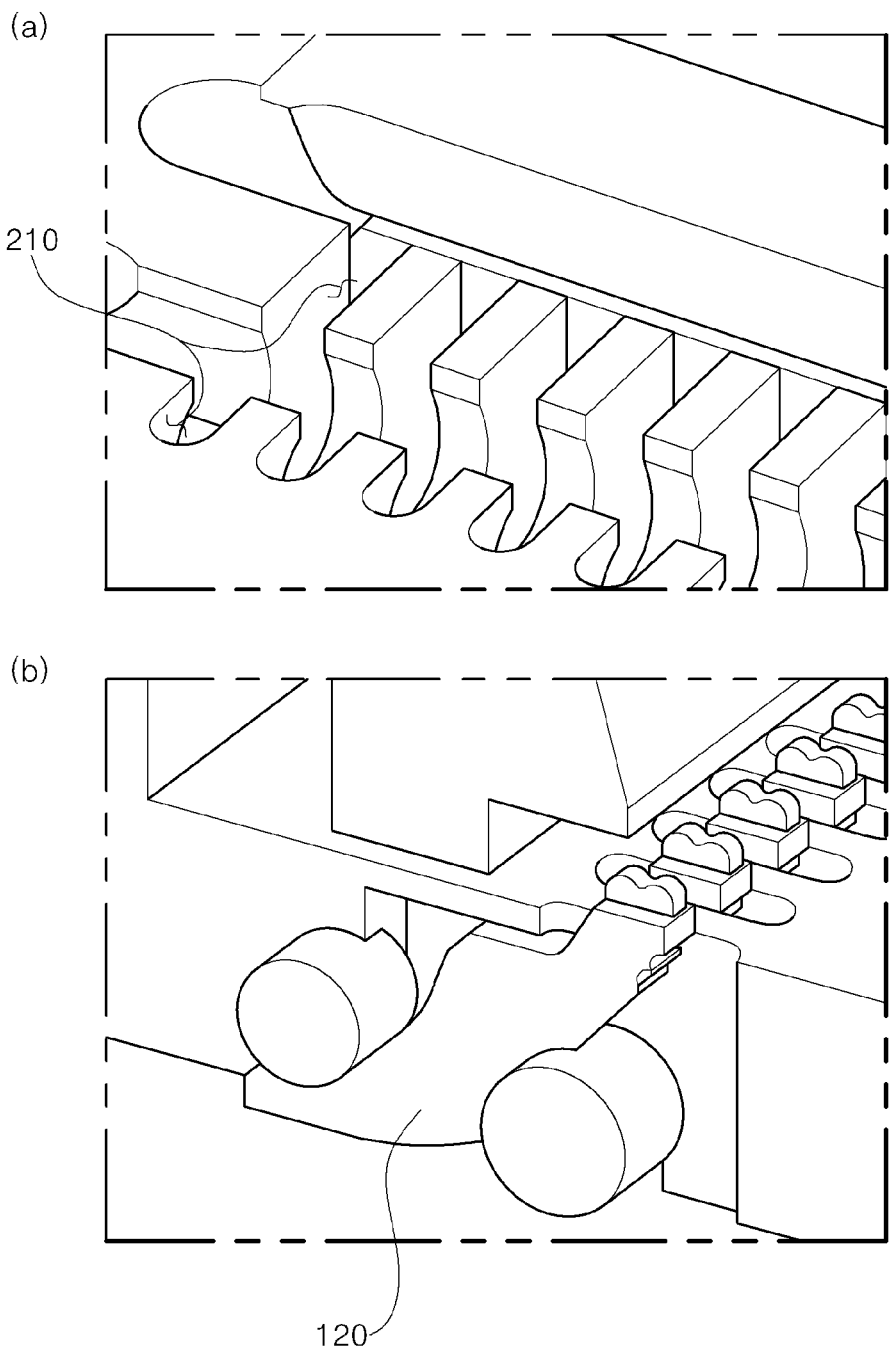

[Figure 3]
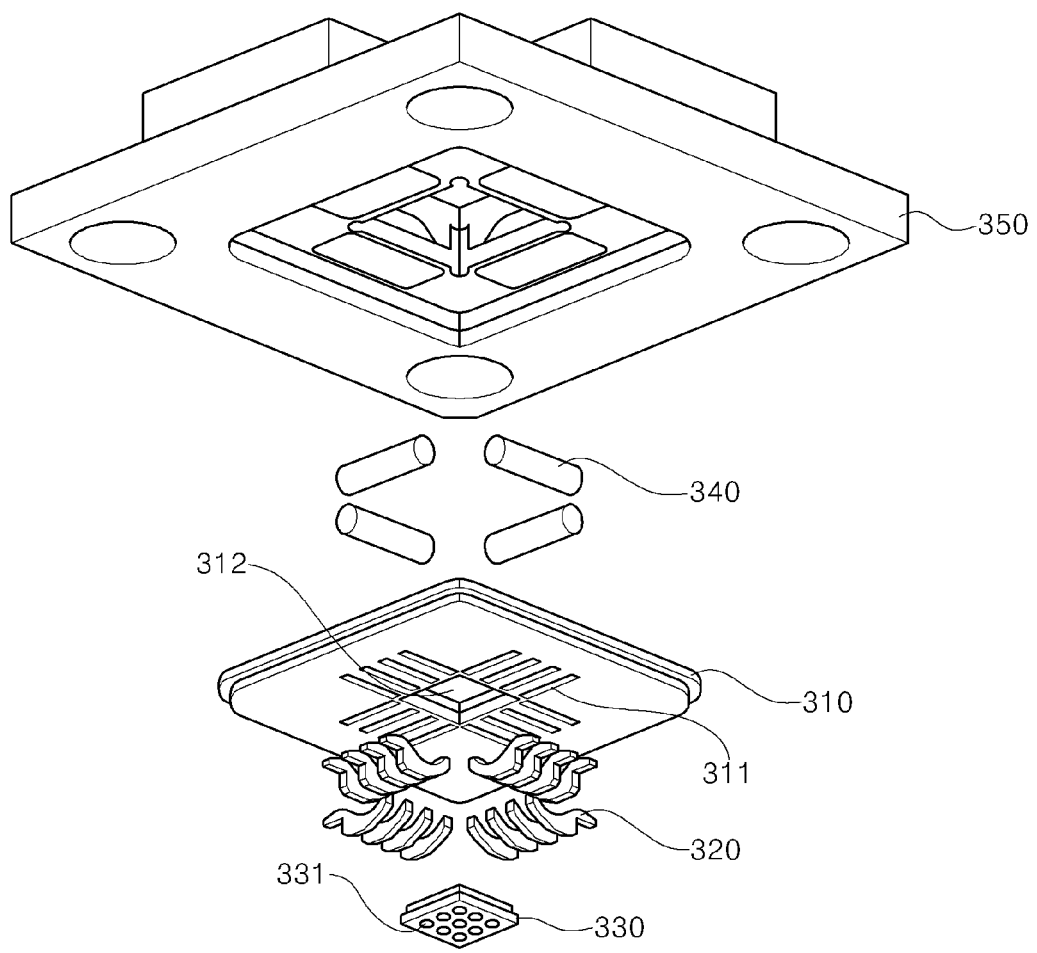

[Figure 4]
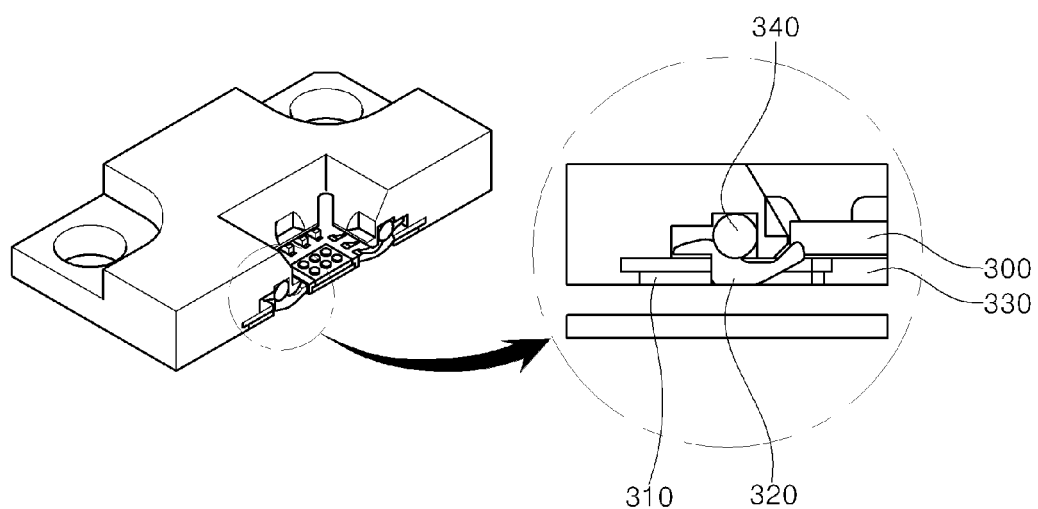

【Figure 5】
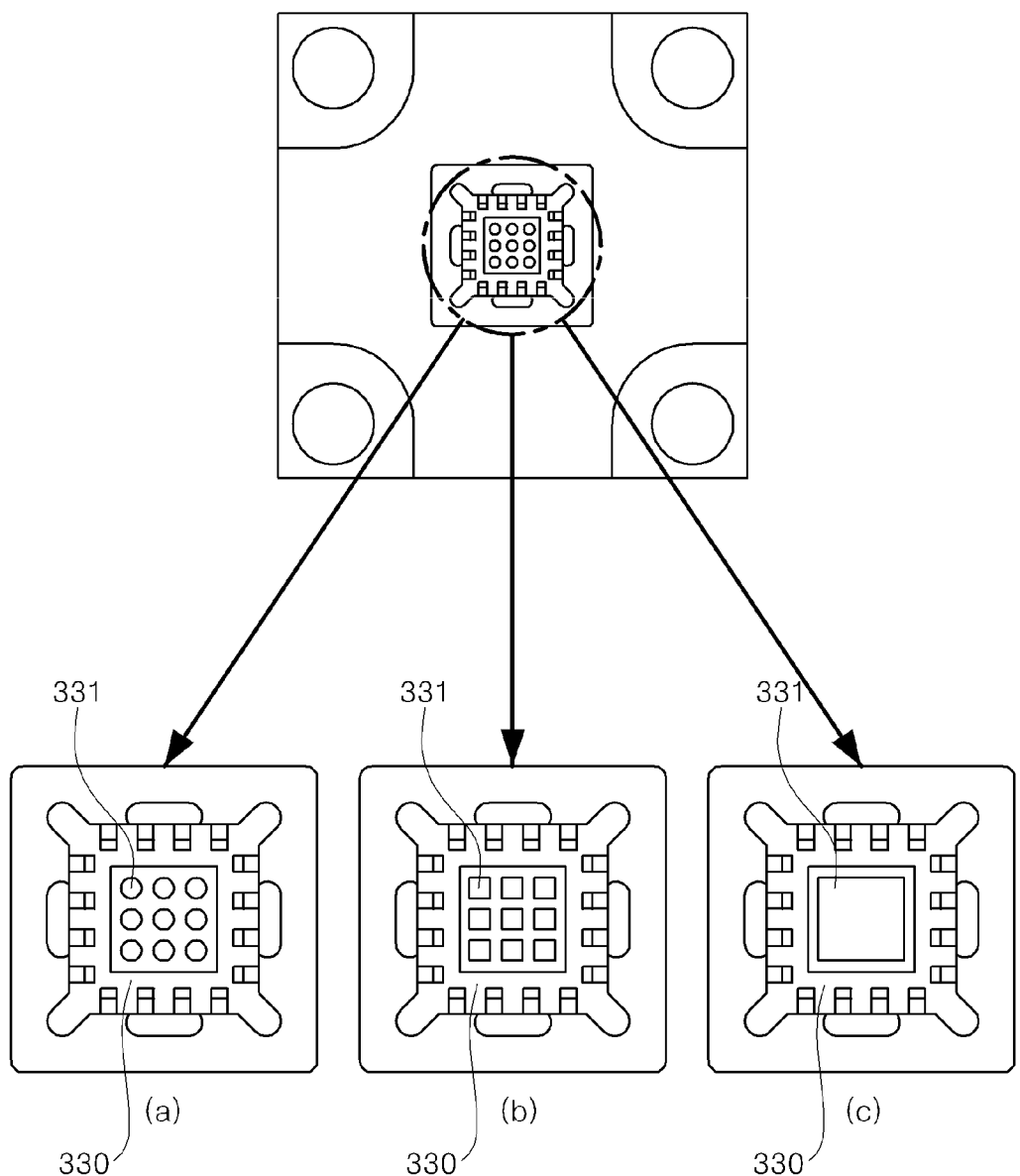

SOCKET FOR SEMICONDUCTOR CHIP TEST AND METHOD OF MANUFACTURING THE SAME

CROSS-REFERENCE TO RELATED PATENT APPLICATIONS

This application is the U.S. national stage application of International Patent Application No. PCT/KR2014/001122, filed Feb. 11, 2014, which claims priority to Korean Application No. 10-2013-0041650, filed on Apr. 16, 2013, in the Korean Intellectual Property Office, the entire contents of which is hereby incorporated by reference.

BACKGROUND OF THE INVENTION

Field of the Invention

The present invention relates to a socket for a semiconductor chip test and a method of manufacturing the socket, and more specifically, to a socket for a semiconductor chip test having improved stability upon a semiconductor test and a method of manufacturing the socket.

Description of the Related Arts

In general, various for a semiconductor chip produced by a semiconductor chip manufacturing process have been carried out in order to confirm reliability of the product.

Among these tests, a test for electrical characteristics conducted for testing as to whether or not normal operation is performed and the breaking of wire is generated by connecting all input and output terminals of a semiconductor package to test signal generating circuits has been widely used.

FIGS. 1 and 2 are views illustrating a sock for a semiconductor chip test according to a conventional art.

As illustrated in FIG. 1, a conventional socket for a semiconductor chip test includes a semiconductor chip test pin 110 connected to a terminal of a semiconductor chip and a ground pin 120 connected to a ground terminal of the semiconductor chip.

An insertion portion of the chip test pin 110 and the ground pin 120 constitutes, as shown in FIG. 2(a), a slot 210 through processing, and thereafter, the ground pin 120 is inserted into the slot 210 as illustrated in FIG. 2(b).

However, in order to form the insertion portion of the chip test pin 110 and the ground pin 120 according to the conventional art, a high-priced engineering plastic material, such as torlon and the like should be used, machined surfaces of the slot should diagonally form a quadrangular through hole because the insertion part of the pin is based on the principle as if one side of a seesaw is pushed, and power is then transmitted to another side, thereby allowing a contact in one direction, and the diagonal quadrangular through hole should be formed in four directions, so great processing expenses are incurred.

Also, according to the conventional art, since a ground contact area of the ground pin 120 is small, it is problematic in that a frequency characteristic is deteriorated at the time of performing a radio frequency (RF) semiconductor test, and thus a production yield rate is reduced. Furthermore, it is problematic in that the plurality of ground pins 120 should be used in order to improve a heat generation or frequency characteristic of the ground pin 120.

Furthermore, according to the conventional art, since the ground pin 120 is composed of a metal block, it has no elasticity. Thus, it is problematic in that contact performance is low, and thus contact stability is also low.

SUMMARY OF THE INVENTION

The present invention has been made keeping in mind the above problems occurring in the related art. An aspect of the present invention provides a socket for a semiconductor chip test which is configured such that a terminal hole for disposing a semiconductor chip test terminal and a pad combination hole for disposing the conductive elastic pad are formed in a film layer using a laser process so that production expenses can be greatly reduced and the product can be efficiently produced, compared to a conventional socket configuration which is required to process high-priced engineering plastic for disposing a chip test terminal.

Another aspect of the present invention provides a socket for a semiconductor chip test which is configured such that a portion connected to a ground terminal of a semiconductor chip is composed of a conductive elastic pad, and thus aground contact area with the ground terminal is sufficiently obtained so that a frequency characteristic and heat generation problem at the time of performing a radio frequency (RF) semiconductor test can be solved.

According to an aspect of the present invention, a socket for a semiconductor chip test may include: a film layer; a semiconductor chip test terminal disposed on the film layer and connected to a terminal of a semiconductor chip; and a conductive elastic pad disposed on the film layer and connected to a ground terminal of the semiconductor chip.

The conductive elastic pad may be composed by including metal powders in silicone rubber, and may be disposed in a center portion of the film layer.

The film layer may have a pad combination hole formed for disposing the conductive elastic pad using a laser process or a press process.

The conductive elastic pad may include a conductive area corresponding to the ground terminal of the semiconductor chip, wherein the conductive area is disposed in plural number on the conductive elastic pad.

The film layer may be made of any one material of polyimide, polyethylene, polypropylene, and polyester, and may be composed of a single film or multiple films.

According to another aspect of the present invention, a method of manufacturing a socket for a semiconductor chip test may include: disposing a semiconductor chip test terminal connected to a terminal of a semiconductor chip on a film layer; and disposing a conductive elastic pad connected to a ground terminal of the semiconductor chip on the film layer.

The method may further include forming the conductive elastic pad by including metal power in silicon rubber at the time of disposing the conductive elastic pad.

The disposing of the conductive elastic pad may be performed by disposing the conductive elastic pad in a center portion of the film layer.

The disposing of the semiconductor chip test terminal may be performed by forming a pad combination hole for disposing the conductive elastic pad in the film layer using a laser process or a press process, and disposing the conductive elastic pad in the pad combination hole.

The method may further include forming the conductive elastic pad to include a conductive area corresponding to the ground terminal of the semiconductor chip at the time of disposing the conductive elastic pad.

The conductive area may be formed to be disposed in plural number on the conductive elastic pad.

The disposing of the semiconductor chip test terminal may be performed by forming a terminal hole on the film layer using a laser process or a press process, and disposing the semiconductor chip test terminal in the terminal hole.

EFFECT OF THE INVENTION

Furthermore, according to the present invention, since the terminal hole for disposing the semiconductor chip test terminal and the pad combination hole for disposing the conductive elastic pad are formed, it is advantageous in that the production expenses can be greatly reduced and the product can be efficiently produced, unlike a conventional socket which is configured such that because the insertion part of the pin for disposing the chip test terminal is based on the principle as if one side of a seesaw is pushed, and power is then transmitted to another side, thereby allowing a contact in one direction, machined surfaces of the slot should diagonally form a quadrangular through hole and the diagonal quadrangular through hole should be formed in four directions, so great processing expenses are incurred because a high-priced engineering plastic material should be processed.

BRIEF DESCRIPTION OF THE DRAWINGS

A portion connected to the ground terminal of the semiconductor chip is composed of the conductive elastic pad, a ground contact area with the ground terminal is sufficiently obtained so that a frequency characteristic and heat generation problem at the time of performing a radio frequency (RF) semiconductor test can be solved.

FIGS. 1 and 2 are views illustrating a socket for a semiconductor chip test according to a conventional art;

FIG. 3 is an ed perspective view of a socket for a semiconductor chip test according to one exemplary embodiment of the present invention;

FIG. 4 is a cross-sectional view of the socket for the semiconductor chip test according to the one exemplary embodiment of the present invention; and FIG. 5 is a top view of the socket for the semiconductor chip test according to one exemplary embodiment of the present invention.

DETAILED DESCRIPTION OF THE INVENTION

Exemplary embodiments according to the present invention will now be described more fully hereinafter with reference to the accompanying drawings. In the following description, it is to be noted that, when the detailed description of publicly known functions or elements related with the present invention may make the gist of the present invention unclear, the detailed description thereof will be omitted. Also, it should be understood that the shape and size of the elements shown in the drawings may be exaggeratedly drawn to provide an easily understood description of the structure of the present invention, but it should not be interpreted that the shape and size of the elements mean a shape and size which are applied practically.

FIG. 3 is an exploded perspective view of a socket for a semiconductor chip test according to one exemplary embodiment of the present invention.

The configuration of a socket for a semiconductor chip test according to one exemplary embodiment of the present invention will be described in detail with reference to FIG. 3.

As illustrated in FIG. 3, the socket for the semiconductor chip test according to the present exemplary embodiment of the invention includes: a film layer 310; a semiconductor chip test terminal 320; and a conductive elastic pad 330. Furthermore, the socket further includes a fixing pin 340 and an outer housing 350.

The film layer 310 is made of any one material of polyimide, polyethylene, polypropylene, and polyester.

The film layer 310 have a terminal hole 311 formed to dispose the semiconductor chip test terminal 320 using a laser process or a press process and a pad combination hole 312 formed to dispose the conductive elastic pad 330.

At this time, the terminal hole 311 and the pad combination hole 312 are formed perpendicular to a width face of the film layer 310 at the time of the laser or press process.

Meanwhile, the film layer 310 is configured by laminating a plurality of films, more preferably, two films as illustrated in FIG. 3.

The film layer 310 is configured by laminating the films as described above, and since a terminal hole 311 for disposing the semiconductor chip test terminal 320 and a pad combination hole 312 for disposing the conductive elastic pad 330 are formed in the film layer, it is advantageous in that the product expenses can be y reduced and the product can be efficiently produced, compared to a conventional socket configuration which is required to process a high-priced engineering plastic material for disposing the chip test terminal 320.

The conductive elastic pad 330 is disposed on the film layer 310 and is connected to aground terminal of the semiconductor chip.

At this time, the conductive elastic pad 330 is disposed in the pad combination hole 312 formed in a center portion of the film layer 310.

The conductive elastic pad 330 is formed by including metal power in silicone rubber.

Explaining it in more detail, the conductive elastic pad 330 includes a conductive area 331 formed to correspond to the ground terminal of the semiconductor chip, and the metal powder is included in the conductive area 331.

As such, when a portion connected to the ground terminal of the semiconductor chip is composed of the conductive elastic pad 330, a ground contact area with the ground terminal is sufficiently obtained so that a frequency characteristic and heat generation problem at the time of performing a radio frequency (RF) semiconductor test can be solved.

The semiconductor chip test terminal 310 is disposed in the terminal hole 311 of the film layer 310 and is formed to surround the conductive elastic pad 330 at the periphery of the conductive elastic pad 330.

The fixing pin 340 functions to fix the semiconductor chip test terminal 320.

FIG. 4 is a cross-sectional view of the socket for the semiconductor chip test according to the one exemplary embodiment of the present invention.

As illustrated in FIG. 4, the socket for the semiconductor chip test is configured such that the conductive elastic pad 330 is provided in the pad combination hole of the film layer 310, and in the terminal hole of the film layer, the semiconductor chip test terminal 330 is fixed by the fixing pin 340.

When the semiconductor chip 300 to be tested is positioned on the socket for the semiconductor chip test which is configured as described above, the terminal of the semiconductor chip 300 is connected to the semiconductor chip test terminal 320, and the ground terminal of the semiconductor chip 300 is connected to the conductive elastic pad 330.

Accordingly, thanks to the conductive elastic pad 330, a ground contact area with the ground terminal of the semiconductor chip 300 is sufficiently obtained so that a heat generation problem can be solved and test stability for a high radio frequency (RF) circuit can be improved.

FIG. 5 is a top view of the socket for the semiconductor chip test according to the one exemplary embodiment of the present invention.

The configuration of the conductive elastic pad of the socket for the semiconductor chip test according to the present exemplary embodiment of the invention will be described in more detail with reference to FIGS. 4 and 5.

The conductive elastic pad 330 is disposed on the film layer 310, and more specifically, in the pad combination hole 312 formed in the center portion of the film layer 310.

The conductive elastic pad 330 is formed by including metal power in silicon rubber, and at this time, has the conductive area 331 formed to correspond to the ground terminal of the semiconductor chip.

That is, the conductive area 331 of the conductive elastic pad 330 is configured to include metal power, thus enabling a test for the ground terminal of the semiconductor chip to be performed.

Meanwhile, as illustrated in (a) or (b) of FIG. 5, the conductive area 331 may be configured such that the plurality of conductive areas is equally disposed on the conductive elastic pad 300. (a) of FIG. 5 shows an example in which the conductive area 331 is composed of a plurality of circular areas which is regularly arranged, and (b) of FIG. 5 shows an example in which the conductive area 331 is composed of a plurality of quadrangular areas which is regularly arranged.

Unlike this, as illustrated in (c) of FIG. 5, the conductive area 331 may be provided in the center portion of the conductive elastic pad 330.

As such, the conductive area 331 may be configured in various shapes at a position corresponding to the ground terminal of the semiconductor chip.

A method of manufacturing a socket for a semiconductor chip test according to another exemplary embodiment of the present invention will be hereinafter described with reference to FIGS. 3 to 5.

First, the film layer is configured by laminating a plurality of films.

At this time, as illustrated in FIGS. 3 and 4, the film layer 310 is configured by laminating the plurality of films.

For example, the film layer 310 may be configured by laminating a second film on a first film.

After this, the pad combination hole 312 and the terminal hole 311 are formed in the film layer 310 which is configured as described above using a laser process or a press process. The pad combination hole 312 is formed in the center portion of the film layer 310, and the terminal hole is provided to surround the pad combination hole 312.

At this time, the pad combination hole 312 and the terminal hole 311 are formed perpendicular to a width face of the film layer 310 by performing a laser process or a press process with regard to the film layer 310.

Then, the conductive elastic pad 330 and the semiconductor chip test terminal 320 are disposed in the pad combination hole 312 and the terminal hole 311, respectively, which are formed as described above.

The conductive elastic pad 330 is composed by including metal power in silicon rubber, and more specifically, the conductive elastic pad 330 has the conductive area 331 formed using the metal powder to correspond to the ground terminal of the semiconductor chip.

At this time, as illustrated in (a) or (b) of FIG. 5, the conductive area 331 is configured such that the plurality of the conductive areas is equally disposed on the conductive elastic pad 330, or as illustrated in (c) of FIG. 5, the conductive area 331 is configured such that the conductive area is disposed in the center portion of the conductive elastic pad 330.

Meanwhile, the semiconductor chip test terminal 320 is disposed in the terminal hole 311 positioned at the periphery of the conductive elastic pad 330 of the film layer 310 as illustrated in FIG. 3, and is fixed by the fixing pin 340 as illustrated in FIG. 4.

As reviewed above, according to the present invention, since the film layer is processed using laser beams, the production expenses can be greatly reduced compared to a conventional art which is required to process a high-priced engineering plastic material.

Also, according to the present invention, when a portion connected to the ground terminal of the semiconductor chip is composed of the conductive elastic pad, a ground contact area with the ground terminal is sufficiently obtained so that a frequency characteristic and heat generation problem at the time of performing a radio frequency (RF) semiconductor test can be solved.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

What is claimed is:

1. A socket for a semiconductor chip test, comprising:
   a film layer;
   a semiconductor chip test terminal disposed on the film layer and connected to a terminal of a semiconductor chip; and
   a conductive elastic pad disposed on the film layer and connected to a ground terminal of the semiconductor chip,
   wherein the film layer has a pad combination hole formed to dispose the conductive elastic pad using a laser process or a press process.

2. The socket of claim 1, wherein the conductive elastic pad is composed by including metal powder in silicone rubber and is disposed in a center portion of the film layer.

3. The socket of claim 1, wherein the conductive elastic pad includes a conductive area corresponding to the ground terminal of the semiconductor chip, wherein the conductive area is disposed in plural number on the conductive elastic pad.

4. The socket of claim 1, wherein the film layer is made of any one material of polyimide, polyethylene, polypropylene, and polyester, and is composed of a single film or multiple films.

5. A method of manufacturing a socket for a semiconductor chip test, the method comprising:
   disposing a semiconductor chip test terminal connected to a terminal of a semiconductor chip on a film layer; and
   disposing a conductive elastic pad connected to a ground terminal of the semiconductor chip on the film layer,
   wherein the disposing of the conductive elastic pad is performed by forming a pad combination hole for disposing the conductive elastic pad in the film layer using a laser process or a press process, and disposing the conductive elastic pad in the pad combination hole.

6. The method of claim 5, further comprising forming the conductive elastic pad by including metal power in silicon rubber at the time of disposing the conductive elastic pad.

7. The method of claim 5, wherein the disposing of the conductive elastic pad is performed by disposing the conductive elastic pad in a center portion of the film layer.

8. The method of claim 5, further comprising forming the conductive elastic pad to include a conductive area corresponding to the ground terminal of the semiconductor chip at the time of disposing the conductive elastic pad.

9. The method of claim 8, wherein the conductive area is formed to be disposed in plural number on the conductive elastic pad.

10. The method of claim 5, further comprising forming the film layer by laminating a second film on a first film before disposing the semiconductor chip test terminal.

11. The method of claim 5, wherein the disposing of the semiconductor chip test terminal is performed by forming a terminal hole on the film layer, and disposing the semiconductor chip test terminal in the terminal hole.

* * * * *